United States Patent [19]

Black

[11] Patent Number: 5,559,471

[45] Date of Patent: Sep. 24, 1996

[54] AMPLIFIER AND BIASING CIRCUIT THEREFOR

[75] Inventor: Gregory R. Black, Vernon Hills, Ill.

[73] Assignee: Motorola, Inc., Schaumburg, Ill.

[21] Appl. No.: 361,927

[22] Filed: Dec. 21, 1994

[51] Int. Cl.$^6$ ........................................ H03F 3/193
[52] U.S. Cl. .................. 330/277; 330/136; 330/279; 330/296; 455/127
[58] Field of Search .................... 330/136, 277, 330/279, 285, 296; 455/127

[56] References Cited

U.S. PATENT DOCUMENTS

| | | | |
|---|---|---|---|
| 5,363,058 | 11/1994 | Sasaki | 330/136 |
| 5,432,473 | 7/1995 | Mattila et al. | 330/134 |

Primary Examiner—James B. Mullins
Attorney, Agent, or Firm—Randall S. Vaas; Kirk W. Dailey

[57] ABSTRACT

An amplifier contains an RF generated negative supply wherein the RF input of the negative generator is connected to the RF input of a first power amplifier stage. This arrangement allows the power supplies to be turned-on in the correct order, thus, avoiding any damage to the transistors or power supply. After the RF input turns on and the RF generated negative supply turns on, the power amplifier transistors are biased such that no current will flow from the drain to the grounded source. The power amplifier also features the ability to adjust the biasing voltage by increasing Vcontrol so that the bias current from the main supply can be controlled. Since the output power of the amplifier is monotonic with biasing current over the useful range of gate voltages, the output power can thereby be controlled by adjusting the control voltage. Additionally, the negative biasing voltage can be increased to the point where bias current from the main supply is at the correct level to achieve the desired output power. Depending on the required output power control range, it may be necessary to use a voltage controllable attenuator, VCA, to simultaneously adjust the RF level into the amplifier while adjusting the biasing voltage.

15 Claims, 5 Drawing Sheets

1
AMPLIFIER AND BIASING CIRCUIT THEREFOR

FIELD OF THE INVENTION

Generally, the present invention relates to power amplifiers and more specifically to power amplifiers that include a biasing supply circuit for providing a negative bias voltage to an amplifier stage.

BACKGROUND OF THE INVENTION

Power amplifiers are often used in radiotelephones. Radiotelephone power amplifiers require sufficient gain, output power, and control range while maintaining efficiency of power supply current usage, small physical size, and weight. Power amplifiers typically include one or more cascaded amplifier stages. Each stage includes a transistor and circuits for biasing the transistor.

A silicon bipolar transistor or the silicon field effect transistor (FET) are most often used in radio frequency (RF) power amplifiers (PA). These devices usually require two positive-voltage power supplies: a main supply that feeds a large DC current into the collector or drain, and a biasing supply that controls the amount of DC current from the main supply. The biasing supply can also be manipulated to control the output power of the amplifier. It can be difficult to provide the gain and output power requirements of many radiotelephone power amplifiers which operate at the higher radio frequencies, such as 1.5 GHz and above, using transistors that are made with silicon. The difficulties are caused by gain and bandwidth limitations of the transistors.

Gallium arsenide, GaAs, Metal-Semiconductor field effect transistors, (MESFET) have higher gain and bandwidth due to higher electron mobility in gallium arsenide and are predominantly used at these frequencies. The higher gain and bandwidth of the MESFETs enables the design of power amplifiers with better user-perceived quality due to better efficiency of power supply current usage at lower radio frequencies such as 800 MHz. Like silicon transistors, GaAs MESFETs require two power supplies: a main supply connected to the drain and a biasing supply connected to the gate.

The GaAs MESFETs used in power amplifiers are usually n-channel depletion mode devices. In depletion mode devices, the gate threshold voltage, which is the voltage required for the device to begin conducting current from the drain to the grounded source, is negative, which means that the biasing supply must be capable of negative output voltages. GaAs MESFET based power amplifiers are operated optimally in class AB mode such that the gate voltage is set slightly above the negative threshold voltage. A manual or automatic biasing supply voltage adjustment is necessary for each amplifier because of variations of the gate threshold voltage from part to part and over temperature. Since at lower gate voltages, the gain and output power are reduced, the gate voltage can be varied to control the output power.

Additionally, it is necessary that the biasing power supply of a GaAs MESFET is always turned on before the main power supply is turned on. This is because while the biasing supply is turned off and the gate to source voltage is zero, the device is turned on and the drain and source are connected together through the device. If the main supply is turned on before the biasing supply, the main supply will be connected to ground through the transistor resulting in a current surge and possibly damaging the transistor or the power supply.

2

Therefore, GaAs MESFET based power amplifiers usually employ a switch connected between the main supply and the drain which allows the main supply to be turned on only after the biasing supply goes negative.

Figure 1:
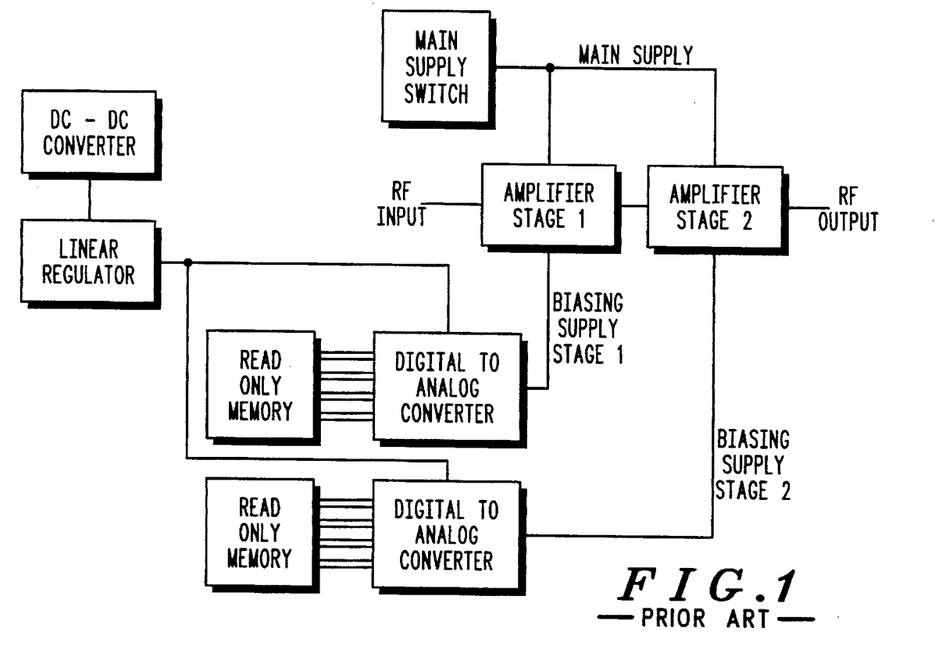
FIG. 1 is a block diagram illustration of a power amplifier that is available in the prior art.

The benefits of better performance of GaAs MESFETs is often offset by the additional complexity of the biasing circuitry compared to silicon transistors. In a previous two stage GaAs MESFET amplifier, the biasing circuit consisted of a converter circuit for generating a negative voltage, a voltage regulator for removing noise generated in the converter, and digital to analog converters, DACs, for converting the regulator output to the correct room-temperature biasing voltages for each amplifier stage, configured as illustrated in FIG. 1. The manufacturing of each radiotelephone containing the amplifier illustrated in FIG. 1 included the steps of measuring the required biasing voltage, and storing the digital code needed to program the DAC in a programmable read-only memory, ROM. There was no means for adjusting the bias voltage over temperature, or for adjusting the bias voltage as a means for controlling output power. The circuits which are needed for bias control including the voltage converter, the voltage regulator, the DACs, and the gain controllable driver added cost, size and weight to the radiotelephone. Furthermore, the bias voltage measurement and storage into memory added to the manufacturing cost. Finally, the lack of bias voltage control to compensate for temperature variations reduced the efficiency of power supply usage at temperature extremes. Some of these problems were addressed in more recent power amplifier design.

Figure 2:
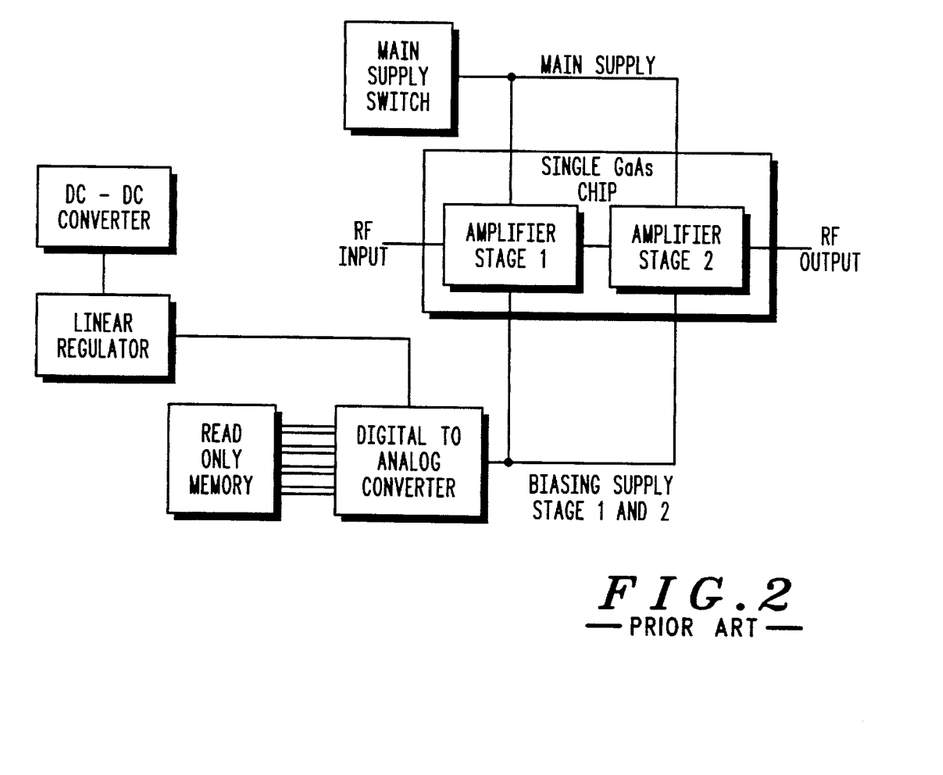
FIG. 2 is a block diagram illustration of a power amplifier that is available in the prior art.

Another feature of a GaAs MESFET based amplifier is the isolation of the transistors from the bulk semiconductor material on the GaAs transistor chip. Thus, multiple independently operated transistors can be integrated on a single chip. These separate transistors have similar electrical properties, and in particular have gate threshold voltages which are substantially the same because they are on the same chip. Thus, the biasing circuits of FIG. 1 can be simplified by designing the amplifiers such that they reside on the same chip and can utilize a common negative bias generating circuitry, configured as shown in FIG. 2.

Figure 3:
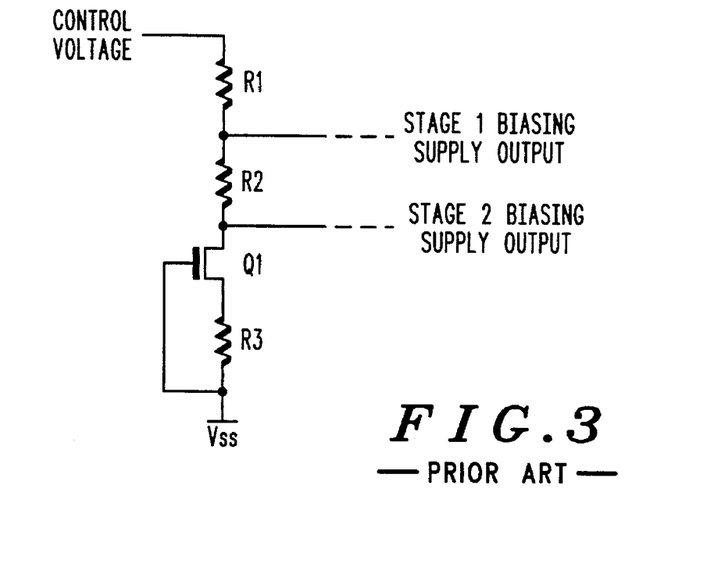
FIG. 3 is a circuit diagram illustration of a threshold tracking regulator available in the prior art.

A further known improvement to GaAs MESFET technology employs a circuit which converts a negative input voltage into a biasing supply voltage. This biasing supply voltage tracks the negative gate threshold voltage of the transistors. A negative threshold tracking regulator is illustrated in FIG. 3. If the input negative supply voltage, Vss, is sufficiently negative, then the voltage across R3 is approximately the gate threshold voltage, Vt. In a two stage amplifier, it is often desirable to have the biasing voltage of the driver, or first power amplifier stage, set higher than the biasing voltage of the final, or second power amplifier stage. For this reason, there are two biasing output voltages, Vout1 and Vout2, connecting the gates of the first amplifier transistor and the second amplifier transistor, respectively. Since the output voltages, Vout1, minus the control voltage, Vcontrol, is equal to the voltage across R1, and the same amount of current goes through resistors R1 and R3, the output voltage, Vout1, is approximately determined by the following formula.

$$Vout1 = Vt*(R1/R3) + Vcontrol \quad (1)$$

and similarly, $$Vout2 = Vt*((R1+R2)/R3) + Vcontrol \quad (2)$$

Since the output voltage of the circuit tracks the threshold voltage the circuit tends to suppress negative supply voltage, Vss, variations, thereby, allowing the elimination of the linear regulator circuit, the DAC and the memory of the amplifier illustrated in FIG. 2. Additionally, the manufacturing steps of measuring the threshold voltage and storing the digital code corresponding to it in the memory are also eliminated.

Figure 4:
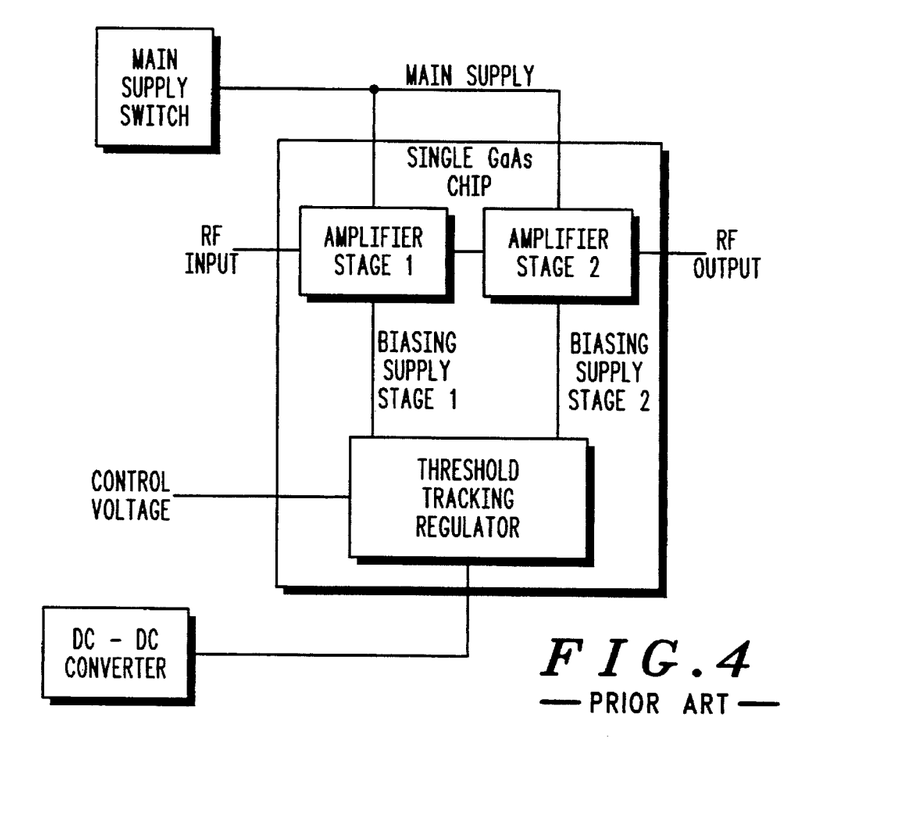
FIG. 4 is a block diagram illustration of a power amplifier that is available in the prior art.

An amplifier employing an integrated threshold tracking negative supply generator is configured as shown in FIG. 4. Although this amplifier is greatly simplified over the original brute-force approach of FIG. 1, the amplifier chip still requires a negative supply voltage which is conventionally supplied from a separate DC to DC converter. In a typical mode of operation, R1 would be chosen to be slightly higher than R2 such that when Vcontrol is zero, the output voltage, Vout, is slightly more negative than the negative threshold voltage. When the control voltage increases, the output voltage increases by the same amount. In this way, the bias control signal Vcontrol, can be used to control output power since the amplifier output power capability is monotonically related to gate voltage over the normal operating range.

Although the foregoing descriptions of GaAs MESFET power amplifiers offer improvement over previously available power amplifiers, there is a need to maximize the efficiency that a GaAs MESFET power amplifier can offer. Specifically, there is a need for a GaAs MESFET based amplifier employing an integrated RF generated negative bias supply generator circuit where the output voltage tracks the gate threshold voltage of the GaAs FET transistors and automatically adjusts the bias voltage to the optimum value over temperature, and can be operated without current surges from the main power supply when the device is turned on, and is adjustable so that the amplifier output power can be controlled.

DESCRIPTION OF A PREFERRED EMBODIMENT

A preferred embodiment of the present invention includes a GaAs FET based power amplifier having improved performance due to the high electron mobility in the GaAs transistors. The power amplifier contains an RF generated negative supply wherein the RF input of the negative generator is connected to the RF input of a first power amplifier stage. This arrangement allows the power supplies to be turned-on in the correct order, thus, avoiding any damage to the transistors or power supply. After the RF input turns on and the RF generated negative supply turns on, the power amplifier transistors are biased such that no current will flow from the drain to the grounded source. The power amplifier also features the ability to adjust the biasing voltage by increasing Vcontrol so that the bias current from the main supply can be controlled. Since the output power of the amplifier is monotonic with biasing current over the useful range of gate voltages, the output power can thereby be controlled by adjusting the control voltage. Additionally, the negative biasing voltage can be increased to the point where bias current from the main supply is at the correct level to achieve the desired output power. Depending on the required output power control range, it may be necessary to use a voltage controllable attenuator, VCA, to simultaneously adjust the RF level into the amplifier while adjusting the biasing voltage.

Figure 5:
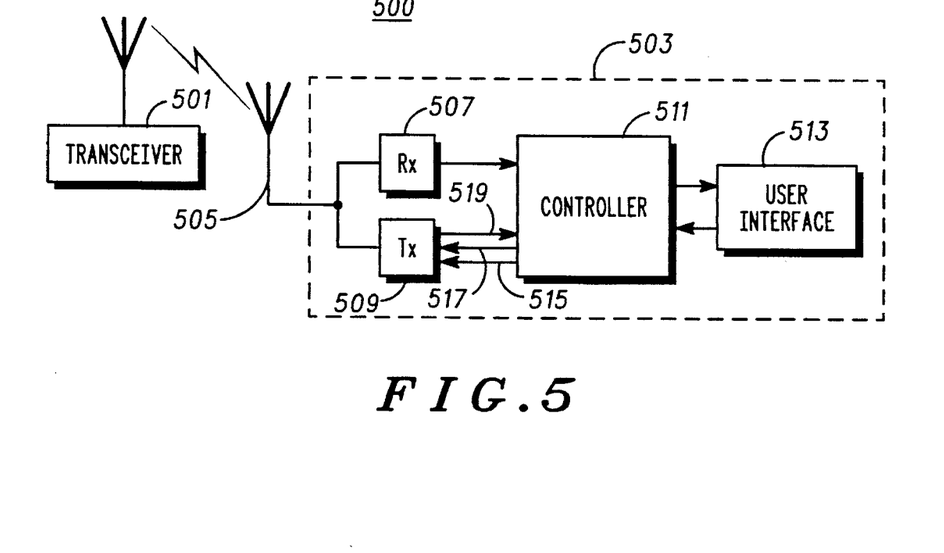
FIG. 5 is an illustration in block diagram form of a radiotelephone communication system preferably incorporating the power amplifier of the preferred embodiment.

FIG. 5 is an illustration in block diagram form of a radiotelephone communication system preferably incorporating the power amplifier of the preferred embodiment. The radiotelephone communication system 500 includes a remote transceiver 501 which sends and receives radio frequency (RF) signals to and from radiotelephones within a fixed geographic area. The radiotelephone 503 is one such radiotelephone contained within the geographic area. The radiotelephone 503 includes an antenna 505, a receiver 507, a transmitter 509, a controller 511, and a user interface 513.

Upon reception of RF signals, the radiotelephone 503 receives the RF signals through the antenna 505. The antenna 505 converts the received RF signals into electrical RF signals for use by the receiver 507. The receiver 507 demodulates the electrical RF signals and recovers the data transmitted on the RF signals and outputs the data to the controller 511. The controller 511 formats the data into a recognizable voice or information for use by the user interface 513. The user interface 513 communicates the received information or voice to a user. Typically, the user interface includes a display, a key pad, a speaker and a microphone.

Upon transmission of radio frequency signals from the radiotelephone 503 to the remote transceiver 501, the user interface 513 transmits user input data to the controller 511. The controller 511 typically includes a microprocessor, memory, and a power amplifier control circuit. The controller 511 formats the information obtained from the user interface and transmits it to the transmitter 509 for conversion into RF modulated signals via the RF input signal 515. Additionally, the controller 511 supplies the transmitter 509 with a control signal 517 having a voltage level. The voltage level of the control signal 517 determines the power of the RF signal output from the transmitter 509. In the preferred embodiment, the transmitter 509 contains a multi-stage power amplifier configuration. The voltage of the control signal 517 is determined by a control circuit contained within the controller 511. The control circuit utilizes the feedback control signal 519 to determine the proper voltage of the control signal 517.

Figure 6:
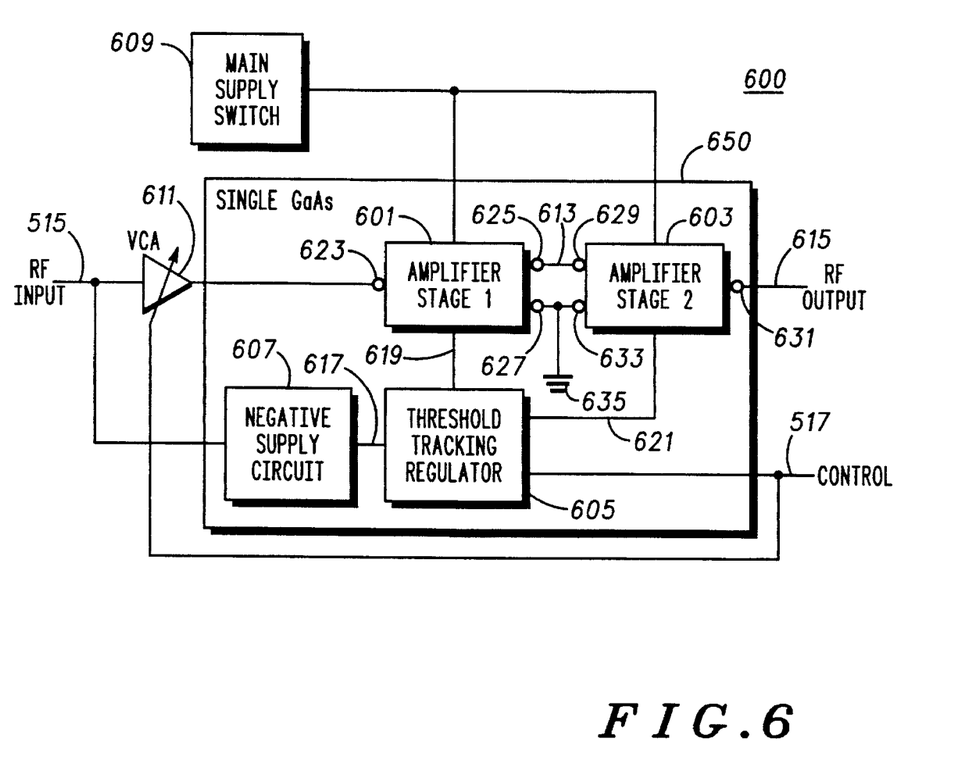
FIG. 6 is a block diagram illustration of an embodiment of a power amplifier in accordance with the present invention.

FIG. 6 is an illustration in block diagram form of an amplifier 600 included in the transmitter 509, previously illustrated in FIG. 5. Here, the amplifier 600 includes a first power amplifier stage 601, a second power amplifier stage 603, a threshold tracking regulator 605, a negative voltage biasing supply circuit 607, a main power supply 609, and a voltage controlled attenuator (VCA) 611. The first PA stage 601, the second PA stage 603, the threshold tracking regulator 605, and the negative voltage biasing supply circuit 607 are all integrated onto a single integrated circuit 650.

In the preferred embodiment the VCA 611 is used to simultaneously adjust the RF level into the amplifier while adjusting the biasing voltage. This allows greater power control of the amplified RF output signal 615 then is available by only adjusting the voltage level of the first and second PA stage bias supply signals 619, 621. It is noted that the VCA 611 is optional and the benefits of the present invention may be employed without a VCA 611.

The first power amplifier (PA) stage 601 includes a GaAs MESFET having a gate port 623, a drain port 625, a source port 627 and a first gate threshold voltage. The source port 627 is coupled to an electrical ground 635. The RF input signal 515, output from the controller 511, is input to the first power amplifier stage 601 via a capacitor (not shown) at the gate port 623. The first power amplifier stage 601 has a bias current for controlling the amplification level. A first PA stage bias supply signal 619 is provided to the first PA stage 601 at the gate port 623 for controlling the bias current from the main supply 609. The bias current flowing through the first PA stage 601 is monotonically related to the voltage level of the control signal 517. The amplified RF signal is output from the first power amplifier stage 601 via the drain port 625 on the data line 613. Additionally, the main power supply 609 is coupled to the first PA stage 601 at the drain port 625.

Figure 8:
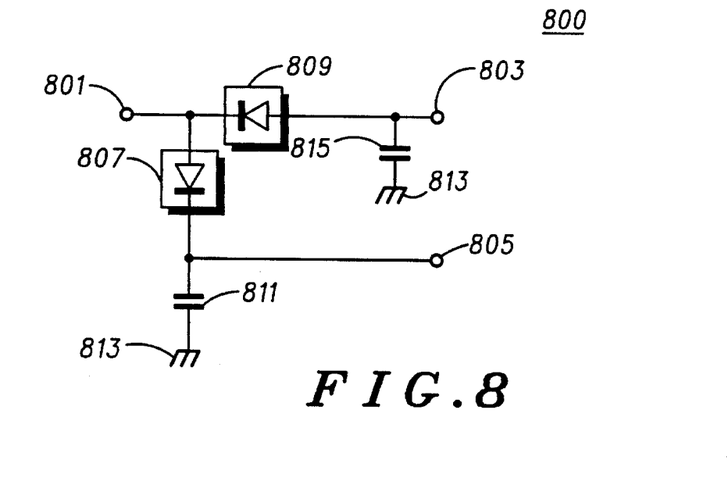
FIG. 8 is a circuit diagram illustration of a full-wave rectifier that is available in the prior art.

The second power amplifier stage 603 includes GaAs MESFET having a gate port 629, a drain port 631, a source port 633 and a gate threshold voltage. The source port 633 is coupled to the electrical ground 635. The data line is coupled to the second power amplifier stage 603 via a capacitor (not shown) at the gate port 629. The second power amplifier stage 603 has a bias current for controlling the amplification level of the second power amplifier stage 603. A second PA stage bias supply signal 621 is provided to the second PA stage 603 at the gate port 629 for controlling the bias current from the main supply 609. The second bias current is monotonically related to the voltage level of the control signal 517. The amplified RF output signal 615 is output from the second power amplifier stage 603 via the drain port 631. The amplified RF output signal 615 contains the RF modulated and amplified data for output on the antenna 505 of FIG. 5. Additionally, the amplified RF output signal 615 is fed back to the controller 511 of FIG. 5 via the feedback control signal 519 of FIG. 5. The feedback control signal 519 indicates the power output level from the second power amplifier stage 603 to the power amplifier control circuit contained within the controller 511 of FIG. 5. The negative voltage biasing supply circuit 607 uses an RF input signal to generate a negative voltage bias signal 617 to the threshold tracking regulator 605. There are several types of rectifiers which can be used as a negative voltage biasing supply circuit including full wave, positive half wave, and negative half wave rectifiers. In the preferred embodiment, the RF generated negative bias supply circuit utilizes a full wave rectifier circuit 800 as illustrated in FIG. 8 and described below. In using the full wave rectifier 800 of FIG. 8 a RF input port 801 is coupled to the RF input signal 515, a negative rectified output port 803 is coupled to the negative voltage bias signal 617, and a positive rectified output port 805 is coupled to an electrical ground. Additionally, the main power supply 609 is coupled to the second PA stage 603 at the drain port 631.

The RF generated negative voltage biasing supply circuit 607 utilizes the RF input signal 515 that is also supplied to the input of the first power amplifier stage 601. The advantage of using the RF input signal 515 is that this signal occupies the same frequency as the amplified RF output signal 615 and does not cause unwanted spurious signals to be coupled onto the amplified RF output signal 615. In some applications the amplified RF output signal 615 has been used; allowing for spurious-free transmission. However, the amplified RF output signal 615 does not have sufficient RF voltage to supply the RF generated negative supply circuit 607 unless the main supply 609 is turned on. This makes it impossible to turn on the negative supply circuit 607 before turning on the main supply circuit, thus, there is a potentially damaging current surge when the amplifier 600 is turned on.

In the embodiment illustrated in FIG. 6, the threshold tracking regulator is of a known type, as described in FIG. 3. This threshold tracking regulator 605 requires the negative voltage bias signal to be at least twice the voltage output from the threshold tracking regulator 605, namely, first PA stage bias supply signal 619 and second PA stage bias supply signal 621.

Figure 7:
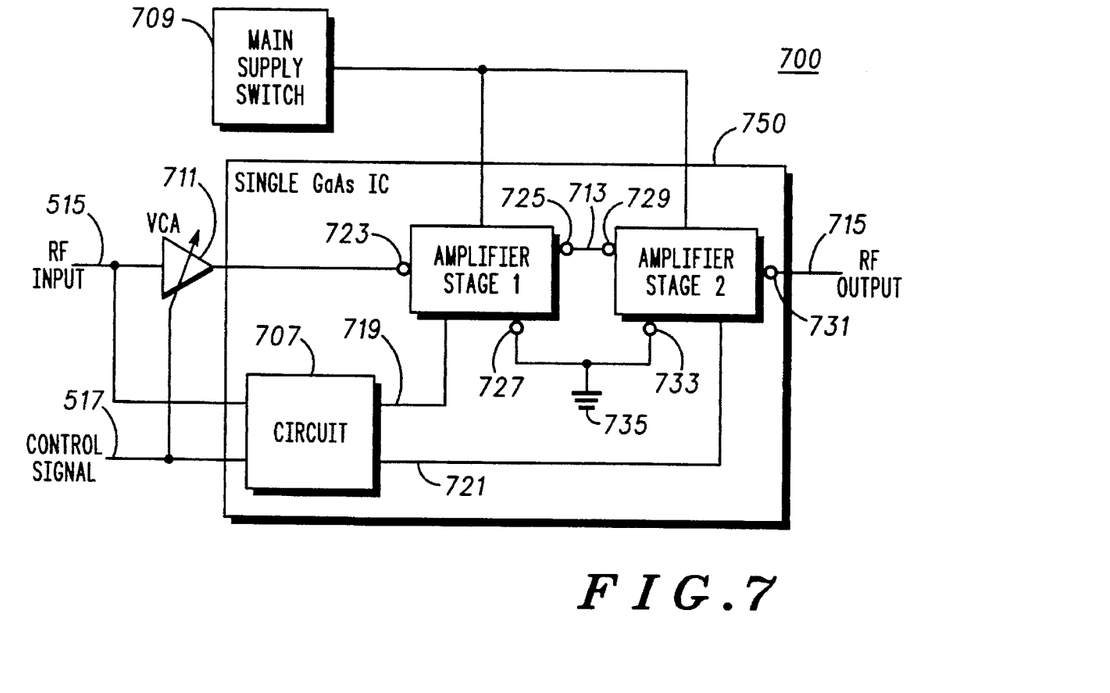
FIG. 7 is a block diagram illustration of an embodiment of a power amplifier in accordance with the present invention.

FIG. 7 is an illustration in block diagram form of an amplifier 700 included in the transmitter 509, previously illustrated in FIG. 5. FIG. 7 is an alternative embodiment of the present invention. The amplifier 700 features a threshold tracking RF generated negative voltage supply circuit 707. Here, the amplifier 700 includes a first power amplifier stage 701, a second power amplifier stage 703, a main power supply 709, and a voltage controlled attenuator (VCA) 711 in addition to the threshold tracking RF generated negative voltage supply circuit 707. The first PA stage 701, the second PA stage 703 and the circuit 707 are all integrated onto a single integrated circuit 750.

In the preferred embodiment the VCA 611 is used to simultaneously adjust the RF level into the amplifier while adjusting the biasing voltage. This allows greater power control of the amplified RF output signal 615 than is available by only adjusting the voltage level of the first and second PA stage bias supply signals 719, 721. It is noted that the VCA 611 is optional and the benefits of the present invention may be employed without a VCA 611.

The first power amplifier (PA) stage 701 includes a GaAs MESFET having a gate port 723, a drain port 725, a source port 727 and a first gate threshold voltage. The source port 727 is coupled to an electrical ground 735. The RF input signal 515, output from the controller 511, is input to the first power amplifier stage 701 via a capacitor (not shown) at the gate port 723. The first power amplifier stage 701 has a bias current for controlling the amplification level. A first PA stage bias supply signal 719 is provided to the first PA stage at the gate port 723 for providing the bias current. The bias current flowing through the first PA stage 701 is monotonically related to the voltage level of the control signal 517. The amplified RF signal is output from the first power amplifier stage 701 via the drain port 725 on the data line 713. Additionally, the main power supply 709 is coupled to the first PA stage 701 at the drain port 725.

The second power amplifier stage 703 includes a GaAs MESFET having a gate port 729, a drain port 731, a source port 733 and a gate threshold voltage. The source port 733 is coupled to the electrical ground 735. The data line 713 is coupled to the second power amplifier stage 703 via a capacitor (not shown) at the gate port 729. The second power amplifier stage 703 has a bias current for controlling the amplification level of the second power amplifier stage 703.

A second PA stage bias supply signal 721 is provided to the second PA stage 703 at the gate port 729 for providing the bias current. The second bias current is monotonically related to the voltage level of the control signal 517. The amplified RF output signal 715 is output from the second power amplifier stage 703 via the drain port 731. The amplified RF output signal 715 contains the RF modulated and amplified data for output on the antenna 505 of FIG. 5. Additionally, the amplified RF output signal 715 is fed back to the controller 511 of FIG. 5 via the feedback control signal 519 of FIG. 5. The feedback control signal 519 indicates the power output level from the second power amplifier stage 703 to the power amplifier control circuit contained within the controller 511 of FIG. 5. Additionally, the main power supply 609 is coupled to the second PA stage 603 at the drain port 631.

The circuit 707 utilizes the RF input signal 515 that is also supplied to the input of the first power amplifier stage 701. This configuration has the advantages as discussed in reference to the RF generated negative voltage supply circuit 607 of FIG. 6. The circuit 707 includes the features of threshold tracking and bias control. The RF generated negative voltage supply function of the circuit 707 utilizes a rectifier. There are several types of rectifiers which can be used to generate the negative supply including full wave, positive half wave, and negative half wave rectifiers.

A preferred full wave rectifier 800 is illustrated in FIG. 8. This full wave rectifier has the best efficiency of RF input power to DC output power conversion. The rectifier 800 has an RF input port 801, a negative rectified output port 803 and a positive rectified output port 805. In the preferred embodiment, the RF input port 801 is coupled to the RF input signal 515 of FIG. 5. The basic full wave rectifier circuitry includes a first circuit element 807 and a second circuit element 809. In the preferred embodiment, the first and the second circuit elements 807, 809 are metal-semiconductor diodes which are available in any GaAs MESFET integrated circuit process. The first diode 807 has a cathode and an anode, the anode is coupled to the RF input port 801 and the cathode is coupled to the positive rectified output port 805 and to an electrical ground 813 through a filtering capacitor 811. The second diode 809 also has a cathode and an anode, the cathode is coupled to the RF input port 801 and the anode is coupled to the negative rectified output port 803 and to the electrical ground 813 through a filtering capacitor 815.

Alternatively, a positive half wave rectifier is realized by utilizing a resistor for the first circuit element 807. Likewise, a negative half wave rectifier is realized by utilizing a resistor for the second circuit element 809. These half wave rectifiers can be used in alternative embodiments. A voltage at the rectifier output ports 803, 805 depend upon a RF voltage at the RF input port 801. For example, if the positive rectified output port 805 is connected to the electrical ground 813 through a low resistance path, and if the output is measured between the negative rectified output port 803 and the electrical ground 813, then the output is a negative voltage which becomes increasingly negative as the RF voltage at the RF input port 801 increases. Similarly, if the negative rectified output port 803 is connected to the electrical ground 813 through a low impedance path and output is measured between the positive rectified output port 805 and the electrical ground 813, then the output is a positive voltage which becomes increasingly positive as the RF voltage at the RF input port 801 increases.

Figure 9:
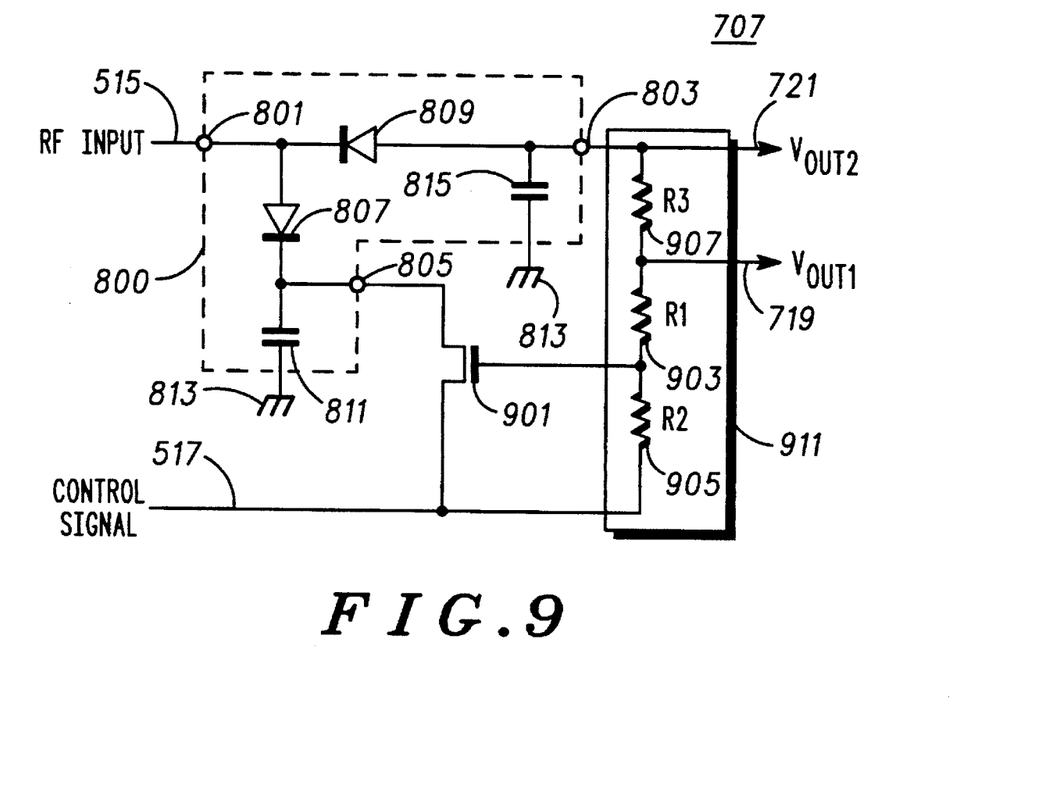
FIG. 9 is a circuit diagram illustration of an embodiment of a power amplifier in accordance with the present invention.

The threshold tracking function provided by the circuit 707 of FIG. 7 is accomplished by connecting a switchable DC termination between the positive rectified output port 805 and the control signal 517 as illustrated in FIG. 9. In FIG. 9, the DC termination switch is a GaAs FET transistor 901 coupled to a resistor network 911. The resistor network 911 contains resistors that have values that effect the relationship between the gate threshold voltages of the amplifier stages 701,703 and the voltage of the biasing supply signals 719, 721 as defined in equations 3 and 4 below. The GaAs FET transistor 901 has a source port, a drain port, a gate port and a gate threshold voltage substantially the same as other transistors on the integrated circuit 750; including the transistors included in the first power amplifier stage 701 and the second power amplifier stage 703.

In the preferred embodiment, the source port of the GaAs FET transistor 901 is connected to the control voltage 517. The drain port is coupled to the positive rectified output port 805. The gate port is coupled to the resistor network 911. Alternatively, in absence of the control voltage 517, the amplifier bias current is fixed and solely determined by the resistor network 911. In the alternative case, the source of the GaAs FET transistor 901 is coupled to an electrical ground.

In the preferred embodiment, the amplifier 700 includes the first and the second power amplifier stages 701, 703. With two power amplifier stages, the resistor network 911 includes a first resistor 903 (R1), a second resistor 905 (R2), and a third resistor 907 (R3). A first end of the third resistor 907 is coupled to the negative rectified output port 803 and the second PA stage bias supply signal 721. A second end of the third resistor 907 is coupled to a first end of the first resistor 903 and to the first PA stage bias supply signal 719. A second end of the first resistor 903 is coupled to a first end of the second resistor 905 and to the gate of the transistor 901. A second end of the second resistor 905 is coupled to the control signal 517 and to the source of the transistor 901.

Alternatively, if the amplifier includes only one power amplifier stage, then the resistor network would include a first resistor, R1, and a second resistor, R2. A first end of the first resistor is coupled to the negative rectified output port and the PA stage bias supply signal. A second end of the first resistor is coupled to a first end of the second resistor and to the gate of the transistor. A second end of the second resistor is coupled to the control signal and to the source of the transistor.

When there is no RF input signal 515 at the RF input port 801, the GaAs FET transistor 901 is turned on and the positive rectified output port 805 is terminated through the transistor 901 to the control signal 517. When the control signal 517 is at zero volts, then the positive rectified output port 805 is terminated to ground, such that when the RF input signal 515 is turned on, the positive rectified output port 805 stays at zero volts and the negative rectified output port 803 begins to go negative. As the drive level from the RF input signal 515 is increased, the negative voltage at the negative rectified output port 803 of the rectifier 800 causes the GaAs FET transistor 901 gate voltage to go below the threshold voltage and a gate voltage of the GaAs FET transistor 901 turns off. The turning off of the GaAs FET transistor 901 causes the termination on the positive rectified output port 805 to change to a high impedance, thus, any further increases in RF drive level on the RF input signal 515 causes an increase in the voltage at the positive rectified output port 805 and the voltage at the negative rectified output port 803 remains unchanged. Thus, for sufficient RF drive level, the voltage from the gate to the source of the GaAs FET transistor 901 is approximately equal to the threshold voltage.

Since the current is the approximately the same through resistors 903, 905 and 907, the voltage on a first PA stage bias supply signal 719 is approximately given by the following formula.

$$Vout1 = Vt*(1+(R1/R2))+Vcontrol \quad (3)$$

Similarly, the voltage on a second PA stage bias supply signal 721 is approximately given by the following formula.

$$Vout2 = Vt*(1+(R1+R3)/R2)+Vcontrol. \quad (4)$$

Vout1 719 and Vout2 721 track the threshold voltage, Vt, with proportionality set by resistors R1 903, R2 905, and R3 907, and an offset that is determined by Vcontrol, the voltage of the control signal 517. Thus, the output power of the amplifier 700 can be controlled by varying the voltage of the control signal 517.

The foregoing descriptions of embodiments of the present invention offer improvement over previously available power amplifiers. Specifically, the amplifier illustrated in FIG. 6 employs an integrated RF generated negative biasing supply circuit and a gate threshold tracking regulator for automatically adjusting the bias voltage to the optimum value over temperature. The amplifier illustrated in FIG. 7 employs an integrated threshold tracking RF generated negative voltage supply circuit for performing the same functions accomplished by the amplifier illustrated in FIG. 6. The amplifier illustrated in FIG. 7 offers the advantage of less parts and more efficient use of the RF input signal while generating the negative voltage bias supply. Both of the amplifiers can be operated without current surges from the main power supply when the device is turned on. Additionally, the amplifiers have adjustable biasing voltages for controlling the amplifier output power. Furthermore, each of the amplifiers include an integrated negative bias generator circuit on the integrated circuit of the amplifier, thereby, eliminating the need for external supply circuitry and reducing size and weight of the amplifier.

What is claimed is:

1. A power amplifier for amplifying a radio frequency (RF) signal, the power amplifier having a RF input signal and a RF output signal, the power amplifier comprising:

an amplifier stage having a gate threshold voltage, a drain port, a gate port and a source port, the source port is connected to an electrical ground, the gate port is coupled to receive the RF input signal, the drain port is coupled to provide the RF output signal;

a main power supply coupled to the drain port of the amplifier stage;

a biasing power supply circuit coupled to receive the RF input signal, the RF input signal being the power supply for the biasing power supply circuit, the biasing power supply circuit to generate a RF generated negative biasing voltage and to supply the RF generated negative biasing voltage to the amplifier stage; and a gate threshold tracking circuit coupled to the gate port of the amplifier stage to track the RF generated negative biasing voltage.

2. The power amplifier in accordance with claim 1, wherein the gate threshold tracking circuit provides for external control of the RF generated negative biasing voltage.

3. The power amplifier in accordance with claim 1 wherein a voltage controlled attenuator is coupled between the RF input signal and the gate port of the amplifier stage.

4. The apparatus in accordance with claim 1 wherein the biasing power supply circuit comprises a rectifier to rectify the RF input signal into the RF generated negative biasing voltage.

5. The apparatus in accordance with claim 4 wherein the biasing power supply circuit further comprises a termination switch coupled to the rectifier to prevent the rectifier from generating the RF generated negative biasing voltage responsive to increases in magnitude the RF input signal beyond a predetermined level.

6. The apparatus in accordance with claim 1 wherein the gate threshold tracking circuit comprises a resistor network coupled between the biasing power supply circuit and gate port of the amplifier stage, the resistor network setting the gate threshold voltage of the amplifier stage.

7. A radiotelephone comprising:

a transmitter comprising:

a power amplifier for amplifying a radio frequency (RF) signal, the power amplifier having a RF input signal and a RF output signal, the power amplifier comprising:

an amplifier stage having a gate threshold voltage, a drain port, a gate port and a source port, the source port is connected to an electrical ground, the gate port is coupled to receive the RF input signal, the drain port is coupled to provide the RF output signal;

a main power supply coupled to the drain port of the amplifier stage, the main power supply being the power supply for the amplifier stage;

a biasing supply circuit being powered by a power supply and having an input port and an output port, the input port coupled to receive the RF input signal, the output port coupled to the gate port of the amplifier stage, the RF input signal being the power supply for the biasing supply circuit, the biasing supply circuit to generate a RF generated negative biasing voltage at the output port, the RF generated negative biasing voltage tracking the gate threshold voltage of the amplifier stage.

8. The radiotelephone in accordance with claim 7, wherein the biasing supply circuit provides for external control of the RF generated negative biasing voltage.

9. The radiotelephone in accordance with claim 7 wherein a voltage controlled attenuator is coupled between the RF input signal and the gate port of the amplifier stage.

10. An apparatus for amplifying a radio frequency (RF) input signal and generating a RF output signal, the apparatus comprising:

a first power amplifier stage having a gate threshold voltage, a drain port, a gate port, a source port and a bias current, the source port is connected to an electrical ground, the gate port is coupled to receive the RF input signal, the drain port is coupled to provide the RF output signal;

a main power supply coupled to the drain port of the first power amplifier stage;

a biasing supply circuit coupled to the first power amplifier stage to generate a bias supply signal, the bias supply signal controlling the bias current of the first power amplifier stage, the biasing supply circuit comprising:

a rectifier having a RF input port, a positive rectified output port and a negative rectified output port, the negative rectified output port is coupled to the gate port of the first power amplifier stage;

a resistor network having a first resistor and a second resistor, a first end of the first resistor coupled to the negative rectified output port, a second end of the first resistor coupled to a first end of the second resistor; and a transistor having a source port, a drain port and a gate port, the source port connected to a second end of the second resistor, the drain port coupled to the positive rectified output port and the gate port connected to the second end of the first resistor and the first end of the second resistor.

11. The apparatus in accordance with claim 10 wherein the biasing supply circuit further comprises a control voltage input, the control voltage input is coupled to the second end of the second resistor and the source port of the transistor.

12. The apparatus in accordance with claim 10 wherein the rectifier further comprises a first filtering capacitor coupled between the positive rectified output port and the electrical ground and a second filtering capacitor coupled between the negative rectified output port and the electrical ground.

13. The apparatus in accordance with claim 10 wherein the rectifier further comprises:

a first voltage generating element having a first end and a second end, the first end coupled to receive the RF input signal, the second end coupled to the positive rectified output port; and a second voltage generating element having a third end and a fourth end, the third end coupled to receive the RF input signal and the fourth end coupled to the negative rectified output port.

14. The apparatus in accordance with claim 10 wherein the rectifier further comprises:

a first diode having a first cathode and a first anode, the first anode coupled to receive the RF input signal, the first cathode coupled to the positive rectified output port; and a second diode having a second cathode and a second anode, the second cathode coupled to receive the RF input signal and the second anode coupled to the negative rectified output port.

15. The apparatus in accordance with claim 10 further comprising:

a second power amplifier stage having a gate threshold voltage, a drain port, a gate port and a source port, the source port of the second power amplifier stage is connected to the electrical ground, the gate port of the second power amplifier stage is coupled to the drain port of the first power amplifier stage, the drain port of the second power amplifier stage is coupled to provide the RF output signal; and the resistor network further comprises a third resistor, a first end of the third resistor is coupled to the negative rectified output port and the gate port of the second power amplifier stage, a second end of the third resistor coupled to the first end of the first resistor and the gate port of the first power amplifier stage.

\* \* \* \* \*